United States Patent [19]

Toth

[11] Patent Number: 5,563,550
[45] Date of Patent: Oct. 8, 1996

[54] RECOVERY OF DATA FROM AMPLITUDE MODULATED SIGNALS WITH SELF-COHERENT DEMODULATION

[75] Inventor: Joe M. Toth, Winnipeg, Canada

[73] Assignee: Lockheed Martin Corporation, Bethesda, Md.

[21] Appl. No.: 520,357

[22] Filed: Aug. 28, 1995

[51] Int. Cl.$^6$ ............................ H03D 1/00; H03D 1/02
[52] U.S. Cl. ................... 329/347; 329/363; 455/337
[58] Field of Search ........................... 329/317, 347, 329/356–357, 363–366, 369–370; 375/320, 321, 317, 318, 319; 455/201–204, 337, 323, 333; 342/175, 195, 202; 327/349, 356–359, 41, 238, 254; 360/29

[56] References Cited

U.S. PATENT DOCUMENTS

| | | | |
|---|---|---|---|
| 4,731,796 | 3/1988 | Masterton et al. | 375/321 X |
| 4,857,859 | 8/1989 | Asahi et al. | 329/363 |
| 5,168,215 | 12/1992 | Puzzo | 455/204 X |

OTHER PUBLICATIONS

Miller, G. M. "Handbook of Electronic Communication" Prentice Hall, Inc., 1979, pp. 69–74.
Morris, D. J., *Communication for Command and Control Systems*, Pergamon Press, Maxwell House, Fairview Park, Elmsford, NY, 1983, pp. 120–125 no month.
Harris Semiconductor product brochure for "Gilbert cell UHF transistor array" designated as HFA 3101, Mar. 1995.
Wintz, P. A. and Totty, R. E., "Principles of Digital Communication," Electro–Technology, Feb. 1967, pp. 75–84.
Integrated Device Technology product book, 1990, Section 7.5, Appliation Note AN–17, pp. 1–2. no month.

*Primary Examiner*—David Mis
*Attorney, Agent, or Firm*—Glenn W. Bowen

[57] ABSTRACT

A demodulation system extracts data from an input amplitude modulated signal electromagnetic wave with a signal multiplying means that has two input terminals both of which are coupled to receive the input amplitude modulated signal. An output terminal of the multiplying means provides an output signal which is the instantaneous square of the input amplitude modulated signal. A lowpass filter is coupled to the output terminal of the signal multiplying means to reject at least twice the carrier frequency $2(\omega_c)$ and higher frequency components, and to pass the second harmonic and lower frequencies of the modulation signal $2(\omega_{m(max)})$ to provide a filtered signal that is representative of the square of the amplitude modulation of the input signal. This demodulation method approaches ideal square law detection with power measurement of the input amplitude modulated signal. The filtered signal is supplied to an analog-to-digital converter to supply a digital data output. The signal may optionally be coupled from the lowpass filter through a square root circuit.

6 Claims, 1 Drawing Sheet

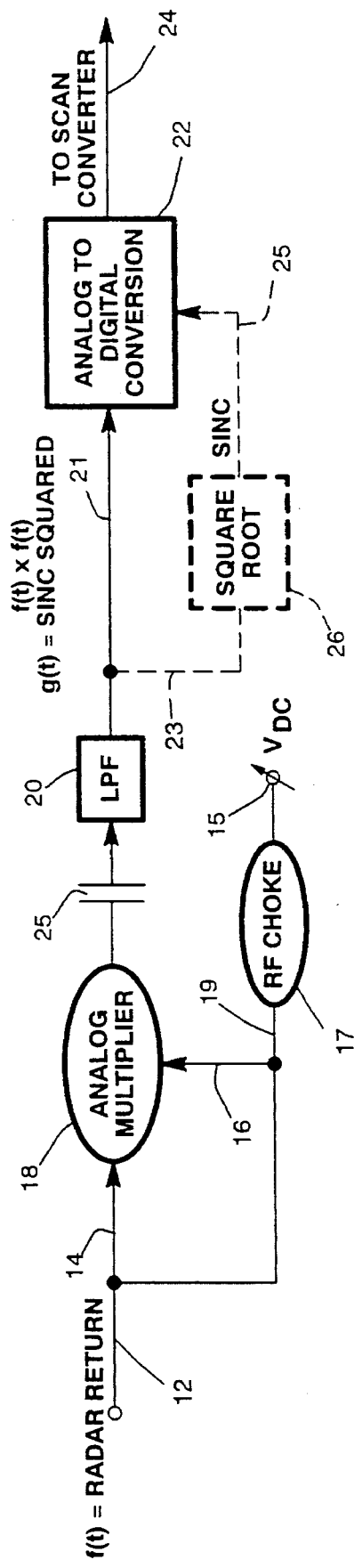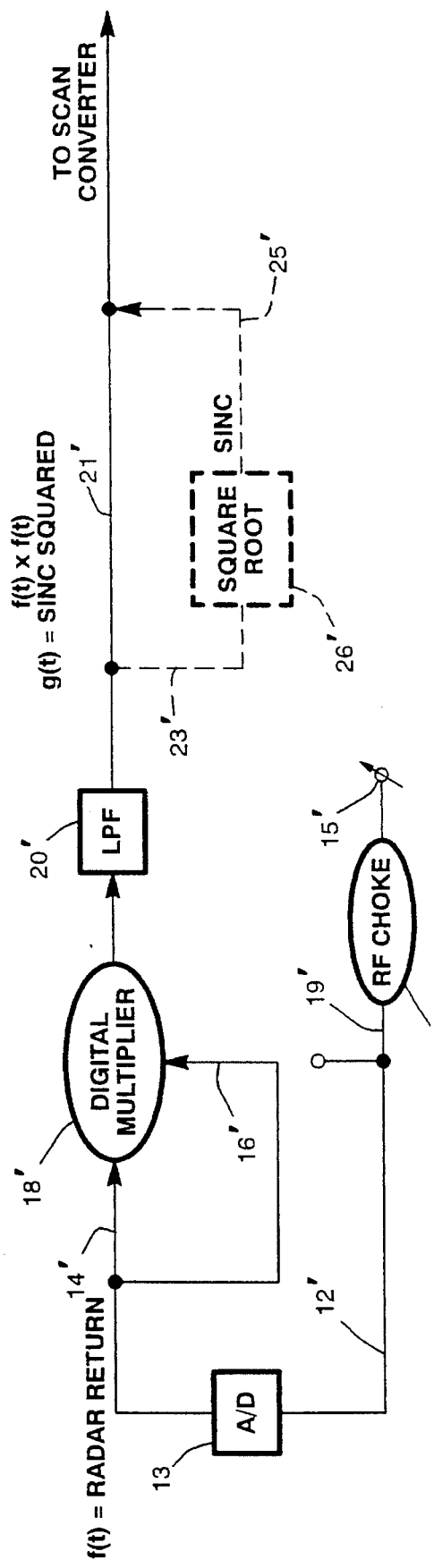
Figure 1
Figure 2

RECOVERY OF DATA FROM AMPLITUDE MODULATED SIGNALS WITH SELF-COHERENT DEMODULATION

FIELD OF THE INVENTION

The invention is related to the demodulation detection of received electromagnetic signals and in particular to the detection of data in radar return signals or AM modulated communication signals.

BACKGROUND OF THE INVENTION

The detection of data in a communications system, radar system, or other type of data-receiving system can be achieved with various demodulation systems. A demodulation system typically consists of a bandpass filter (BPF) which separates the received signal from the noise components outside of the desired frequency spectrum, a detector to recover the baseband signal together with other signal harmonics, and a lowpass filter (LPF) which separates the baseband signal from the higher frequency components of the detected wave.

There are two common modes of detecting data in an AM-modulated signal. These are coherent and non-coherent detection. Coherent detection is also called homodyne, or synchronous, detection, while non-coherent detection is called non-synchronous, or envelope detection. Coherent detection requires that the characteristics of the received signal be known, but this requirement is not necessary for non-coherent detection. Coherent down-conversion in radar applications leaves an error in the detected radar return which is proportional to the velocity and the orientation of targets. Non-coherent down-conversion, or envelope detection, leaves errors in the determination of target size and location. Calibration and drift of the envelope detection circuitry at high radar bandwidths is also a significant problem.

Coherent detection is based upon carrier synchronization of the received signal with the signal from a local oscillator. The received signal, after passing through a bandpass filter, is multiplied with a signal of the same frequency and phase from a local oscillator to produce a multiplied signal on the output of the miltiplexer.

If the incoming signal is represented by:

$$S^*(t)=A(t)\cos \omega_c t,$$

where $S^*$ is the instantaneous value of the carrier signal at time t and the local oscillator is represented by:

$$S(t)=\cos \omega_c t,$$

The multiplication process thus produces the signal:

$$\begin{aligned} S^*(t)S(t) &= A(t)\cos^2\omega_c t \\ &= 1/2A(t)[1+\cos 2\omega_c t] \end{aligned}$$

where $\omega_c$ is the angular carrier frequency and $A(t)$ is the data baseband modulating signal. This mixed, or multiplied, signal is then fed to a lowpass filter which removes the second harmonic of the mixer output signal and leaves the desired baseband signal component:

$$\tfrac{1}{2}A(t)$$

While coherent detection systems have a lower error rate probability than non-coherent systems, the fact that the local oscillator signal must be matched to the frequency and phase of the received signal makes the system impractical for certain applications, such as radar return signals which have unknown modulation, carrier and phase components.

Non-coherent detection systems can achieve the same probability of errors as coherent detection systems, but only at the expense of higher signal-to-noise ratio power. Non-coherent detection is based on envelope detection of the received signals. As in the coherent detection the received signals may first be sent through a BPF. The signal then passes through a limiter to insure that the received signal is of a constant amplitude, and it is then sent to a differentiator circuit. Following differentiation of the signal, an envelope detecting circuit receives the signal. The output of the envelope detecting circuit is supplied to an analog-to-digital converter which converts the signal to digital data.

Extraction of the carrier reference frequency from the received signal to provide a local oscillator signal for coherent detection has been accomplished by passing the received signal through the BPF to a frequency doubler which typically is a square-law modulator. If the received signal is:

$$S^*(t)=A(t)\cos \omega_c t$$

the output signal from the frequency doubler will be $$\begin{aligned} [S^*(t)]^2 &= A^2(t)\cos^2\omega_c t \\ &= 1/2A^2(t) + 1/2A^2(t)\cos 2\omega_c t \end{aligned}$$

The signal is now passed through a highpass filter (HPF) so that only the second harmonic of the carrier signal is retained. The remaining signal is then sent through a limiter and a frequency divider to produce the required carrier output signal $$\pm\cos \omega_c t$$

Production of a carrier reference recovery signal in this manner is not adequate when phase modulation occurs because frequency doubling of the transmitted signal will double both the carrier frequency and the phase changes. In order to recover the carrier signal when phase modulation occurs, phase lock loops of various types are generally employed. In radar systems, the AM return signal contains a carrier reference only during target reflections. Therefore, phase delays in the frequency doubler, limiter and frequency divider make this approach unacceptable in carrier recovery in such systems.

The above discussion of data transmission demodulation of coherent and non-coherent systems and carrier frequency recovery is based upon information found on pages 120–125 of the book *Communication for Command and Control Systems* by D. J. Morris, Pergamon Press, Maxwell House, Fairview Park, Elmsford, N.Y. 10523, ©1983.

A product brochure from Harris Semiconductor, dated March 1995, for their Gilbert cell UHF transistor array product designated as HFA 3101 refers to the possible use of this product as a frequency doubler. This product has two terminals that can serve as modulating and carrier ports of a modulator. The brochure indicates that if the same input signal is fed to both ports, the output frequency will be the sum of the carrier frequency ($\omega_c$) and the modulating frequency ($\omega_c$), and that this is equivalent to twice the input frequency. In addition, it notes that a D.C. component equivalent to the difference of $\omega_c$ and $\omega_m$ is provided. The Harris brochure also shows that zero IF down conversion data demodulation may be obtained with the HFA 3101 circuit by coupling a local oscillator to the carrier, or RF, port and a modulated input signal with the same carrier frequency to the modulating, or L0, port.

An article entitled "Principles of Digital Communication" published in Electro-Technology, February 1967, pages 75–84, by P. A. Wintz and R. E. Totty, describes on pages 77 and 78 a system which may be utilized for determining the average power of a nondeterministic waveform. In this system the waveform is first passed through a bandpass filter to a squaring circuit. The squared output waveform from the square is then passed through a lowpass filter to a DC meter. The lowpass filter is utilized to supply a DC signal average total power. The filter minimizes fluctuations that occur at the DC meter. The intent of this circuit is to substantially capture the average DC component and there is no attempt in the system to extract any information or to provide any demodulation of the waveform.

SUMMARY OF THE INVENTION

A system for data transmission demodulation to recover data from electromagnetic signals is accomplished by coupling the signal to both of the inputs of a multiplier circuit. The output signal from the multiplier circuit is transmitted to a lowpass filter which extracts signals having a frequency at least equal to or greater than twice the carrier frequency, $(2\omega_c)$, while allowing signals having a frequency equal to or less than twice the second harmonic frequency of the maximum frequency of the $(2\omega_{m(max)})$ modulating signal to pass. This leaves a baseband modulating signal which is supplied to an analog-to-digital conversion device, or alternately is coupled through a square root circuit, to produce a data output signal. Direct conversion of the mixer output to the A/D converter provides square law detection which represents the power of the input signal. Power measurement is desirable in radar return processing since it enhances receiver signal-to-noise ratio (SNR), enhances target resolution, lowers the input noise and clutter bias, improves target detection and may lower radar receiver costs. The system may be implemented with either digital or analog techniques or a combination thereof.

DESCRIPTION OF THE DRAWING

The present invention is described by reference to the drawings in which:

FIG. 1 is a block diagram of a radar embodiment that is basically analog with A/D conversion at its output; and FIG. 2 is a block diagram of a radar embodiment in which A/D conversion occurs at the input of a basically digital circuit instead of at the output as in FIG. 1.

TECHNICAL DESCRIPTION OF THE INVENTION

The embodiment of FIG. 1 is used in a radar system which emits an amplitude modulated (AM) signal from an antenna. Objects or targets that are in the path of the electromagnetic wave signal reflect emitted pulses back to the antenna for reception. The emitted signal has a carrier at the mid-band frequency of the band limited band of frequencies which is amplitude-modulated, preferably by a sinc modulation function wave, although a sin modulation function is also suitable. The received pulse is delayed in time by an amount proportional to the location of the object. Thus, every object in line with the radar will reflect an emitted pulse to provide an amplitude modulated input to the radar receiver. In the radar implementation the radar signal may have a frequency as high as 1.3 GhZ carrier frequency, $(\omega_c)$, and a bandwidth on the order of 480 MhZ.

The AM signal is down-converted from the transmitted carrier to the baseband signal by injecting the received signal into both ports of a non-linear mixer so that non-linear operation of a mixer produces the square of the modulation envelope at its output. If the modulation signal is a sinc function, for example, the resulting $sinc^2$ baseband signal will have a background noise level which is less than the input noise. Targets which provide return signals at a level greater than the input signal will then be detected. The bandwidth of the return signal that is utilized is twice the input bandwidth which results in greater resolution at the location of the target. The baseband signal, which represents the power of the input signal, is then sampled by a high-speed digital-to-analog converter and is presented to a scan converter. The scan converter supplies a display which shows each target with enhanced resolution at its true location.

A conventional analog, or digital, square root circuit can optionally be applied to the baseband signal for extracting a sinc signal rather than a $sinc^2$ signal before inputting the signal to the scan converter. In this case the output signal represents the voltage and not the power of the input signal. The square root function can be implemented in a known manner by connecting the inverting input of a differential amplifier to the output of the LPF, the non-inverting input to ground and the output of the differential amplifier to the two input lines of a four-quadrant multiplier device sold by Analog Devices under the part number AD834. Other ways of mathematically deriving the square root value of an analog signal were previously disclosed in the analog computing art. The output of the AD834 device is coupled to the inverting input of the differential amplifier to provide an operational amplifier square root extraction circuit.

The system of the present invention, which is illustrated by reference to FIG. 1 is a new method of data transmission demodulation which regenerates data from a received signal. The signal may be transmitted directly from a communication device or it may be a reflected signal, such as a satellite signal or a radar return signal. The system closely resembles a coherent detection system, but the problems associated with the distortion that occurs due to phase modulation in coherent detection systems are eliminated.

As shown in FIG. 1 the income radar return signal is provided on the line 12 where it is sent on the lines 14 and 16 to the two terminals of the multiplier or mixer 18. The signal on the line 12 is typically passed through a bandpass filter (BPF) to limit the frequency spectrum. The output signal from the mixer 18:

$$f(t) \times f(t) = F(\omega) \cdot f(\omega)$$

is defined mathematically by the following equations where:

$$f(t) = \mathfrak{F}^{-1}\{F(\omega)\} = \frac{\sin(2\pi Bt)}{2\pi Bt} e^{j\{\omega t + \phi(t_d)\}} \qquad (1)$$

$$F(\omega) = \text{Bandlimited Radar Emission} \qquad (2)$$

$$\mathfrak{F}^{-1}\{F(\omega)\} = \frac{1}{2\pi}\int_{-\infty}^{\infty} F(\omega)e^{at}d\omega = \text{Inverse Fourier Transform} \qquad (3)$$

$$\phi(t_d) = \text{Phase modulation from Target velocity and/or orientation} \qquad (4)$$

$$g(t) = \text{mixer output given by Taylor Series expansion} \qquad (5)$$

$$= K_o f(t) + K_1 f(t) \times f(t) + K_2 f(t) \times f(t) \times f(t) + \ldots$$

$$= K_1 \left\{ \frac{\sin(2\pi Bt)}{2\pi Bt} \right\}^2 e^{-j\omega_c t - \phi(t_d) + j\omega_c t + \phi(t_d)} + \quad (6)$$

$$K_1 \left\{ \frac{\sin(2\pi Bt)}{2\pi Bt} \right\}^2 e^{j2\omega_c t + 2\phi(t_d)} +$$

$$= \left\{ \frac{\sin(2\pi Bt)}{2\pi Bt} \right\}^2 \text{ (after lowpass filtering with cutoff at } 4\pi B\text{)} \quad (7)$$

Equation 1 represents f(t) of the return signal which equals the inverse Fourier transform of F(ω), where in this inverse Fourier transform is defined in Equation 3. Equation 4 defined phase modulation due to target velocity and orientation. Equation 5 expresses the fact that g(t) represents the mixer output signal as a function of time may be expressed as a Taylor series expansion which is carried out in Equation 6. Equation 7 represents the mixer output after lowpass filtering with a cut-off frequency that allows the second harmonic frequency component ($4\pi B$) of a sine$^2 2\pi B$ or a sin$^2 2\pi B$ modulating signal to pass in order to preserve the waveform of the modulating signal.

A filter, preferably a lowpass filter (LPF), is employed at the output of the mixer 18 to remove signal frequencies greater than the second harmonic frequency of the maximum information bearing angular frequency ($2\omega_{m(max)}$) in the input signal and to output the resulting baseband signal squared. The filter could alternately be a filter that only insured rejection of twice the carrier angular frequency ($2\omega_c$) and higher frequency components, but this would allow more noise components to pass. The analog signal may be converted to a digital signal representation in an analog-to-digital conversion circuit 22 coupled to the LPF over the line 21. The A/D converter can optionally process the LPF output signal by extracting its square root in the square root circuit 26 which is coupled to the LPF on the line 23 and to the A/D converter on the line 25. In the illustrated radar embodiment, the output of the A/D converter is supplied on the line 24 to a scan converter (not shown) for converting r,θ data from the A/D converter to x,y data for utilization in x,y coordinate display (not shown). An A/D converter could also be employed in the invention to the conversion of analog-to-digital information for demodulation of signals other than radar signals.

The data demodulation technique described herein is termed "self-coherent detection." In the described embodiment the baseband modulation amplitude is represented by the sinc function, but the technique is not limited by the modulating function. In the preceding equations, f(t) represents the incoming radar return signal as a function of time and F(ω) represents the band limited radar emission of the radar return signal as a function of frequency. Although described in the context of a radar embodiment, the self-coherent digital demodulation detection technique of the invention is of general utility for communication and other data transmissions as well.

The total gain of the embodiment of FIG. 1 can be increased appreciably by providing a DC offset to both of the inputs on the lines 14 and 16 to the multiplier 18, as shown in the following table.

| f(t) Mixer Input (−10 dBm max.) dBm | DC offset Volts | g(t) Mixer Output dBm | Total Gain dB |
|---|---|---|---|
| −130 | 0.000 | −273.010 | −143.010 |
| −130 | 0.125 | −142.041 | −12.041 |
| −130 | 0.250 | −136.021 | −6.021 |
| −130 | 0.500 | −130.000 | 0.000 |
| −130 | 1.000 | −123.979 | 6.021 |
| −130 | 2.000 | −117.959 | 12.041 |
| −130 | 3.000 | −114.437 | 15.563 |
| −130 | 4.000 | −111.938 | 18.062 |
| −130 | 5.000 | −110.000 | 20.000 |
| −10 | 0.000 | −33.010 | −23.010 |
| −10 | 0.125 | −19.878 | −9.878 |
| −10 | 0.250 | −14.872 | −4.872 |
| −10 | 0.500 | −9.407 | 0.593 |
| −10 | 1.000 | −3.678 | 6.322 |
| −10 | 2.000 | 2.193 | 12.193 |
| −10 | 3.000 | 5.665 | 15.665 |
| −10 | 4.000 | 8.138 | 18.138 |
| −10 | 5.000 | 10.061 | 20.061 |

The DC offset is obtained in the embodiment of FIG. 1 by coupling a DC voltage, which may be adjustable, to both inputs 14, 16 of the multiplier 18 over the line 19. The connection is made through an RF choke 17 to keep AC signals from being shorted out in the DC power supply. A capacitor 25 is coupled between the multiplier 18 and the LPF 20 to block the DC offset voltage from reaching the LPF.

The embodiment of FIG. 2 is an alternate version of FIG. 1 which is implemented entirely digitally after the input analog-to-digital converter 13 which receives the input signal on the line 12'. The A/D converter 13 provides digital signals representative of the input signal on the lines 14' and 16' to both inputs of a digital multiplier circuit 18'. The output product of the multiplier 18' is supplied to a digital lowpass filter 20'. Digital filtering to obtain lowpass, highpass or bandpass filtering may be accomplished by digital finite duration impulse response (FIR) filters. The 1990 Integrated Device Technology product book on pages 1 and 2 of Section 7.5 describes the IDT 7201/7202 device in Application Note AN-17, which may be utilized for this purpose in the embodiment of FIG. 2. The output of the LPF 20' may be applied to a radar scan converter or to other circuitry that employs the demodulated digital signal on the line 21'. If desired, the digital signal may be optionally passed to a digital square root extraction circuit 26' on the line 23' before it is sent on the line 25' to the scan converter or other utilization device, such as a radio receiver. The embodiment of FIG. 2 may also employ the gain technique of FIG. 1 by coupling a DC voltage supply 15' through the RF choke 17' to the input line 12'.

What is claimed is:

1. A demodulation system for extracting information from an input amplitude-modulated signal having a maximum information-bearing angular frequency modulation component of $\omega_{m(max)}$ and a carrier frequency of $\omega_c$ comprising, signal multiplying means comprising two input ports both of which are coupled to receive said input amplitude-modulated signal and wherein said signal multiplying means are constructed to provide an output signal which is the instantaneous square of said input amplitude-modulated signal, low-pass filter means coupled to receive said output signal and low-pass filter means is constructed to reject frequency components of at least $2\omega_c$ and higher in order to pass a filtered signal, DC power supply means, means for coupling a DC offset voltage from said DC power supply means to both of said inputs of said multiplying means for controlling the gain of said multiplying means, and means connected between said multiplying means and said low-pass filter means for blocking DC voltages from said low-pass filter means.

2. A demodulation system as claimed in claim 1 wherein said multiplying means and said low-pass filter means are analog signal devices and further comprising an output analog-to-digital converter means coupled to the output of said low-pass filter means to receive said filtered signal for converting said filtered signal to a digital signal that is representative of the amplitude-modulation of said input amplitude modulated signal.

3. A demodulation system as claimed in claim 1 further comprising a square root means coupled to the output of said low pass filter means to receive said filtered signal for providing a square root signal that is representative of the square root of said filtered signal.

4. A demodulation system as claimed in claim 3 further comprising an output analog-to-digital converter means coupled to the output of said square root means for converting said square root signal to a digital signal that is representative of said amplitude-modulation of said input amplitude modulated signal.

5. A demodulation system as claimed in claim 1 further comprising an input analog-to-digital converter means wherein said multiplier means is a digital multiplying device and has its inputs coupled to the output of said input analog-to-digital converter means, the input of said input analog-to-digital converter means is coupled to receive said input amplitude-modulated signal and said low-pass filter means is a digital filter means.

6. A demodulation system as claimed in any of the preceding claims in which said low-pass filter means allows only frequencies of $2\omega_{m(max)}$ and lower to pass.

* * * * *